(12) United States Patent
Bhargava et al.

(10) Patent No.: US 10,050,607 B2
(45) Date of Patent: Aug. 14, 2018

(54) POLYPHASE DECIMATION FIR FILTERS AND METHODS

(71) Applicant: STMicroelectronics International N.V., Amsterdam (NL)

(72) Inventors: Neha Bhargava, Greater Noida (IN); Ankur Bal, Greater Noida (IN)

(73) Assignee: STMicroelectronics International N.V., Amsterdam (NL)

( * ) Notice: Subject to any disclaimer, the term of this patent is extended or adjusted under 35 U.S.C. 154(b) by 177 days.

(21) Appl. No.: 14/573,055

(22) Filed: Dec. 17, 2014

(65) Prior Publication Data
US 2016/0182014 A1 Jun. 23, 2016

(51) Int. Cl.
*H03H 17/06* (2006.01)
*H03H 17/02* (2006.01)

(52) U.S. Cl.
CPC .... *H03H 17/0664* (2013.01); *H03H 17/0275* (2013.01); *H03H 2017/0245* (2013.01)

(58) Field of Classification Search
CPC ....... H03H 17/0273–17/0275; H03H 17/0664; H03H 17/06
USPC ...................................................... 708/313
See application file for complete search history.

(56) References Cited

U.S. PATENT DOCUMENTS

| | | | | |
|---|---|---|---|---|
| 4,924,223 A | * | 5/1990 | Okamoto | G06F 7/48 341/102 |
| 5,910,908 A | * | 6/1999 | Slavin | H03H 17/0664 708/313 |
| 6,041,339 A | * | 3/2000 | Yu | H03H 17/0664 708/313 |
| 6,260,053 B1 | * | 7/2001 | Maulik | H03H 17/0276 708/313 |
| 6,871,207 B1 | | 3/2005 | Nanda et al. | |
| 8,271,567 B2 | * | 9/2012 | Nene | H03H 17/0227 708/203 |
| 2006/0103555 A1 | | 5/2006 | Antonesei | |
| 2013/0110898 A1 | * | 5/2013 | Bal | H03H 17/0664 708/316 |

OTHER PUBLICATIONS

Eugene Hogenauer, An economical class of digital filters for decimation and interpolation, IEEE Transactions on Acoustics Speeck and Signal Processing, vol. ASSP-29, No. 2, May 1981.*

(Continued)

*Primary Examiner* — Aimee Li
*Assistant Examiner* — Emily E Larocque
(74) *Attorney, Agent, or Firm* — Slater Matsil, LLP

(57) ABSTRACT

A polyphase decimation FIR filter apparatus including a modulo integrator circuit configured to integrate input samples and to provide integrated input samples; and a polyphase FIR filter circuit configured to process the integrated input samples, the polyphase FIR filter circuit including a plurality of multiplier accumulator circuits, each configured to accumulate products of coefficients and respective integrated signal samples, wherein each of the multiplier accumulator circuits receives a subset of FIR filter coefficients, wherein the FIR filter coefficients are derived as the nth difference of original filter coefficients, where n is a number of integrators in the integrator circuit, and wherein the FIR filter circuit is configured to perform computation operations with modulo arithmetic.

22 Claims, 10 Drawing Sheets

(56) References Cited

OTHER PUBLICATIONS

Peter Tummeltshammer et al:, *Time-Multiplexed Multiple-Constant Multiplication*, IEEE Transactions on Computer-Aided Design of Integrated Circuits and Systems, vol. 26, issue No. 9, Sep. 2007, pp. 1551-1563.

P.P. Vaidyanathan:, *Multirate Digital Filters, Filter Banks, Polyphase Networks, and Applications: A Tutorial*, Proceedings of the IEEE, vol. 78, issue No. 1, Jan. 1990, pp. 56-93.

Website: "Multiplierless Constant Multiplication," available at: http://spiral.net/hardware/multless.html, Retrieved Jul. 22, 2014.

Arzi, J., "Small tutorial on CIC filters", e-mail: contract AT tsdconseil.fr, Dec. 1, 2015, 9 pages.

Donadio, M.P., "CIC Filter Introduction", m.p.donadio@ieee.org., Jul. 18, 2000, 6 pages.

Hogenauer, E., "An Economical Class of Digital Filters for Decimation and Interpolation"; IEEE Transactions on Acoustics Speech and Signal Processing; vol. ASSP-29; No. 2; May 1981; 9 pages.

\* cited by examiner

| Design Goals | Conventional Filter | Proposed Filter |
|---|---|---|
| Combinational Area ($um^2$) | 3836 | 2069.3 (-46%) |
| Sequential Area ($um^2$) | 902.3 | 1138.8 (+26%) |
| Overall Area ($um^2$) | 4738.3 | 3208.1 (-32.3%) |
| Total Dynamic Power (mW) | 0.03 | 0.024 (-20%) |
| Critical Path Slack (ns) | +11.83 | +12.58 |

FIG. 9

POLYPHASE DECIMATION FIR FILTERS AND METHODS

BACKGROUND

Technical Field

This disclosure relates to polyphase decimation Finite Impulse Response (FIR) filters and to methods for polyphase decimation FIR filtering. More particularly, the disclosure relates to polyphase decimation FIR filters and methods which exhibit low power consumption and small chip area.

Discussion of Related Art

Multi-rate systems have been used in digital signal processing (DSP) and continue to find applications in new and emerging areas. Small area and low power consumption are important criteria in the design of DSP systems. These criteria necessitate efficient implementation of basic building blocks of multi-rate signal processing, namely decimators and interpolators. FIR filters are usually preferred in multi-rate systems over infinite impulse response (IIR) filters because of their inherent stability, easily-designed linear phase response and computational efficiency. Polyphase decomposition of an FIR filter is a power efficient technique as it allows operation of subfilters at lower data rates and also computation of only useful output samples in the case of decimation.

Multiplication is a major source of power dissipation in FIR filters. Techniques have been proposed to achieve low power multipliers. A differential coefficient technique has been proposed to reduce coefficient precision in single rate FIR filters. Notwithstanding these developments, there is a need for improved decimation FIR filters.

SUMMARY

According to one embodiment, a polyphase decimation FIR filter apparatus comprises an integrator circuit configured to integrate input samples and to provide integrated input samples; and a polyphase FIR filter circuit configured to process the integrated input samples. The integrator circuit has a pole at dc and therefore can experience overflow. The use of two's complement arithmetic resolves this overflow situation by keeping the integrator word width equal to the maximum word width that can appear at the filter output for a given input. If we denote the input bit precision by L and the maximum fixed point gain of the filter by G, then the integrator word width=L+G. Using two's complement binary format in the following filter and the same word width, with the filter transfer function being $H(z) \cdot (1-z^{-1})$, where H (z) is the original filter z-domain transfer function, outputs can be computed correctly.

In embodiments the polyphase FIR filter circuit uses a plurality of independent multiplier accumulator circuits operating concurrently on input samples. Each multiplier accumulator circuit performs multiply and accumulate operations for k input cycles, where k is a decimation factor, using sets of k coefficients. After every k input cycles, the coefficients of the multiplier accumulator circuits are changed, but the multiplier accumulator circuits continue accumulating the results. One of the multiplier accumulator circuits is selected to produce an output value after every k input cycles. Thereafter, that particular multiplier accumulator circuit is reset and starts accumulating results from a next set of samples and a next set of coefficients. The sets of coefficients applied to each of the multiplier accumulator circuits and the multiplier accumulator circuit selected for output change in a cyclic manner every k input cycles.

In some embodiments, a polyphase decimation FIR filter apparatus comprises: a modulo integrator circuit configured to integrate input samples and to provide integrated input samples; and a polyphase FIR filter circuit configured to process the integrated input samples, the polyphase FIR filter circuit comprising: a plurality of multiplier accumulator circuits, each configured to accumulate products of coefficients and respective integrated signal samples, wherein each of the multiplier accumulator circuits receives a subset of FIR filter coefficients, wherein the FIR filter coefficients are derived as the nth difference of original filter coefficients, where n is a number of integrators in the integrator circuit, and wherein the FIR filter circuit is configured to perform computation operations with modulo arithmetic.

BRIEF DESCRIPTION OF THE DRAWINGS

For a better understanding of the embodiments, reference is made to the accompanying drawings, which are incorporated herein by reference and in which:

FIG. 9 is a table that provides synthesis results of an example FIR filter.

DETAILED DESCRIPTION

Figure 1:
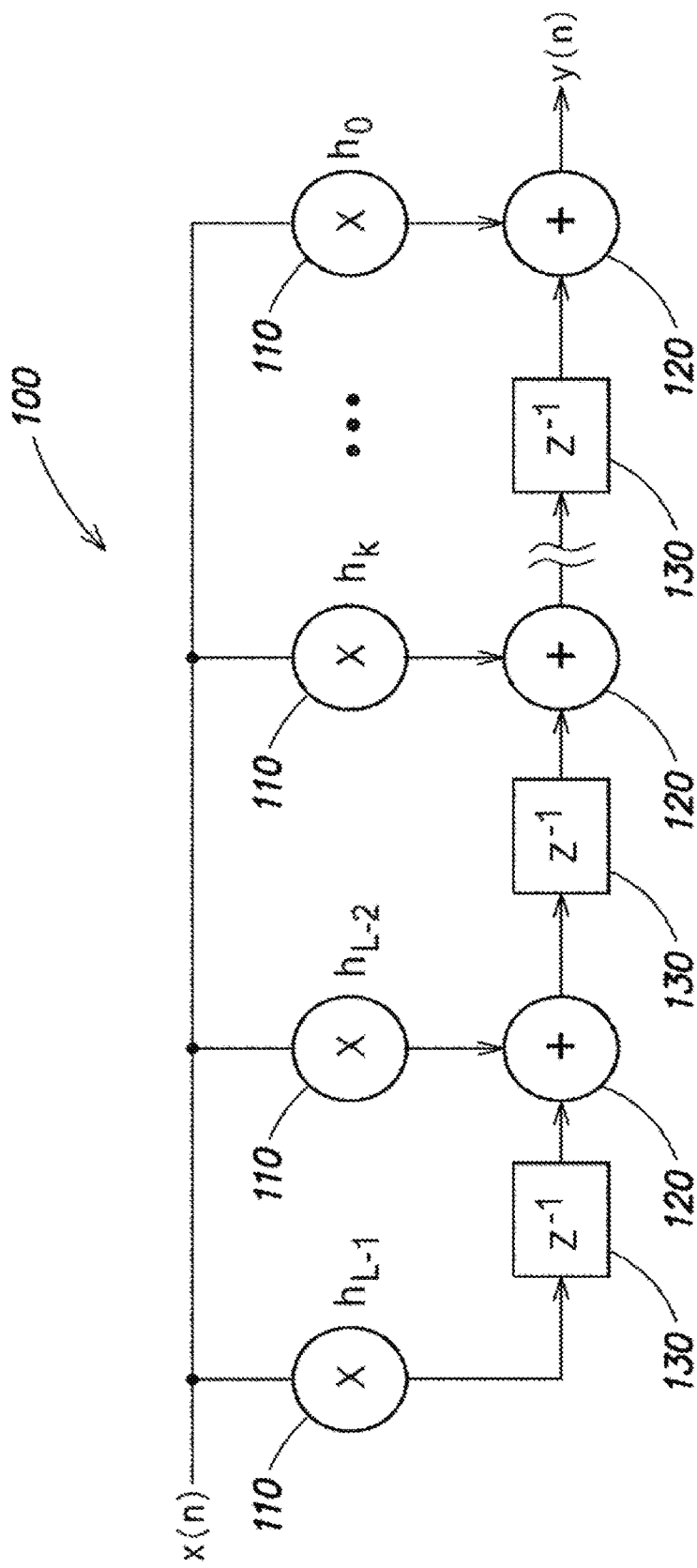
FIG. 1 is a schematic block diagram of a conventional FIR filter.

A block diagram of a conventional FIR filter 100 is shown in FIG. 1. The FIR filter 100 includes multipliers 110, summing units 120 and delay elements 130. The number of multipliers 110 corresponds to the number of filter taps in the FIR filter 100. Input signal samples x(n) are multiplied by respective filter coefficients $h_k$ in multipliers 110 and the results, in each stage except the first stage, are summed with the delayed results from the previous stage to provide an output y(n).

The input signal samples x(n) and the coefficients $h_k$ are multi-bit values. The multiplication performed by multipliers 110 in conventional FIR filters is a major source of power dissipation. Further, the power dissipation increases as the number of filter taps in the FIR filter increases.

Conventional polyphase decimation filters for decimation by k include k subfilters. In the polyphase subfilters, a set of k successive input samples is convolved with sets of k coefficients, each coefficient taken from one of the k subfilters, in calculation of an output. The sets of coefficients are as follows:

First set: h[0], . . . , h[k−2], h[k−1]
Second set: h[k], . . . , h[2k−2], h[2k−1] and
Third set: h[Mk−k+1], . . . , h[Mk−2], h[Mk−1], where k is the decimation factor and M is the number of subfilters.

The partial response to one set of inputs is combined with the response to subsequent sets of inputs until the set of input samples is shifted out of the filter. This fact can be exploited to build a filter structure in which computation can be carried out in independent circuits which are multiplier accumulators. The proposed polyphase decimation FIR filter architecture uses M independent multiplier accumulator circuits operating concurrently on input samples x(n), where M is the number of filter taps T in the filter divided by the decimation factor k.

Figure 2:
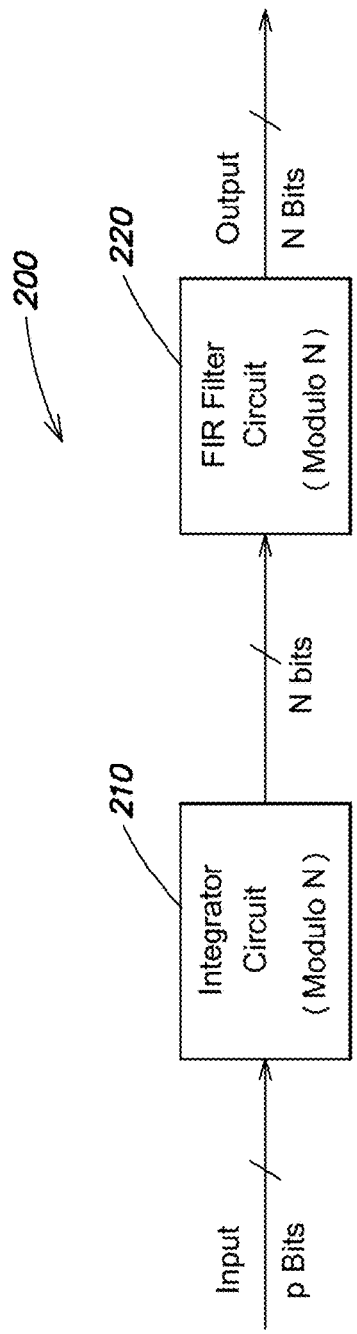
FIG. 2 is a schematic block diagram of a decimation FIR filter in accordance with embodiments.

A schematic block diagram of a decimation FIR filter apparatus in accordance with embodiments is shown in FIG. 2. FIR filter apparatus 200 includes an integrator circuit 210 and a polyphase FIR filter circuit 220 connected in series. The integrator circuit 210 and the polyphase FIR filter circuit 220 operate in a modulo N configuration. The integrator circuit 210 receives an input word of P bits and provides an output of N bits to FIR filter circuit 220. The polyphase FIR filter circuit 220 provides an output of N bits, where N is greater than P. The FIR filter apparatus 200 performs decimation by a decimation factor k. As discussed below, the decimation factor k may be programmable.

The FIR filter apparatus 200 of FIG. 2 takes advantage of a differential coefficient method to minimize the word length of the filter coefficients without compromising the frequency response of the filter, so that the multiply operation consumes less power than in conventional FIR filters. The differential coefficient method exploits the correlation between consecutive coefficients of an FIR filter and uses the difference between the coefficients which can be represented in smaller word lengths than full precision coefficients. The integrator circuit 210 and the FIR filter circuit 220 are discussed in detail below.

Figure 3A:
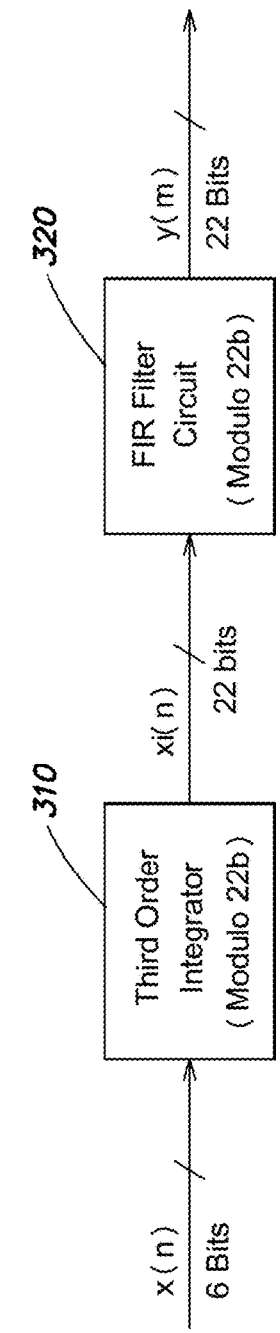
FIG. 3A is a schematic block diagram of a decimation FIR filter in accordance with additional embodiments.

An implementation of the FIR filter apparatus 200 is shown in FIG. 3A. The FIR filter apparatus 200 includes a third order integrator circuit 310 and a polyphase FIR filter circuit 320. The third order integrator circuit 310 and the FIR filter circuit 320 operate in a modulo 22 bit configuration. The third order integrator circuit 310 receives input samples x(n) of 6 bits and provides integrated input samples $x_i(n)$ of 22 bits to FIR filter circuit 320. The FIR filter circuit 320 may utilize new filter coefficients which are derived as the third order difference of the original filter coefficients. The FIR filter circuit 320 provides output samples y(m) of 22 bits. The FIR filter circuit 320 also performs decimation by a decimation factor k. Thus, the filter apparatus 200 of FIG. 3A produces one output sample y(m) for every k input samples x(n). By way of example only, the FIR filter circuit 320 may perform decimation by a decimation factor of 24.

Figure 3B:
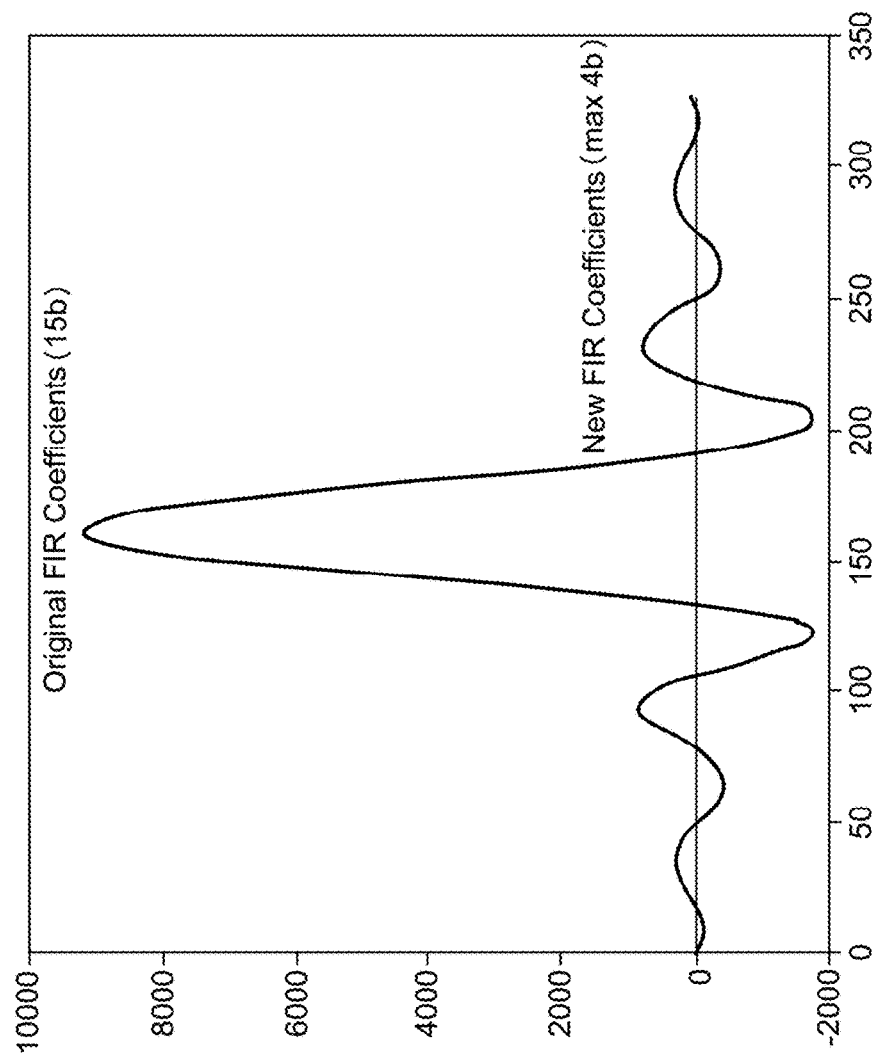
FIG. 3B is a graph of coefficient value as a function of filter tap for an FIR filter having 325 taps and a coefficient size of 15 bits.
Figure 3C:
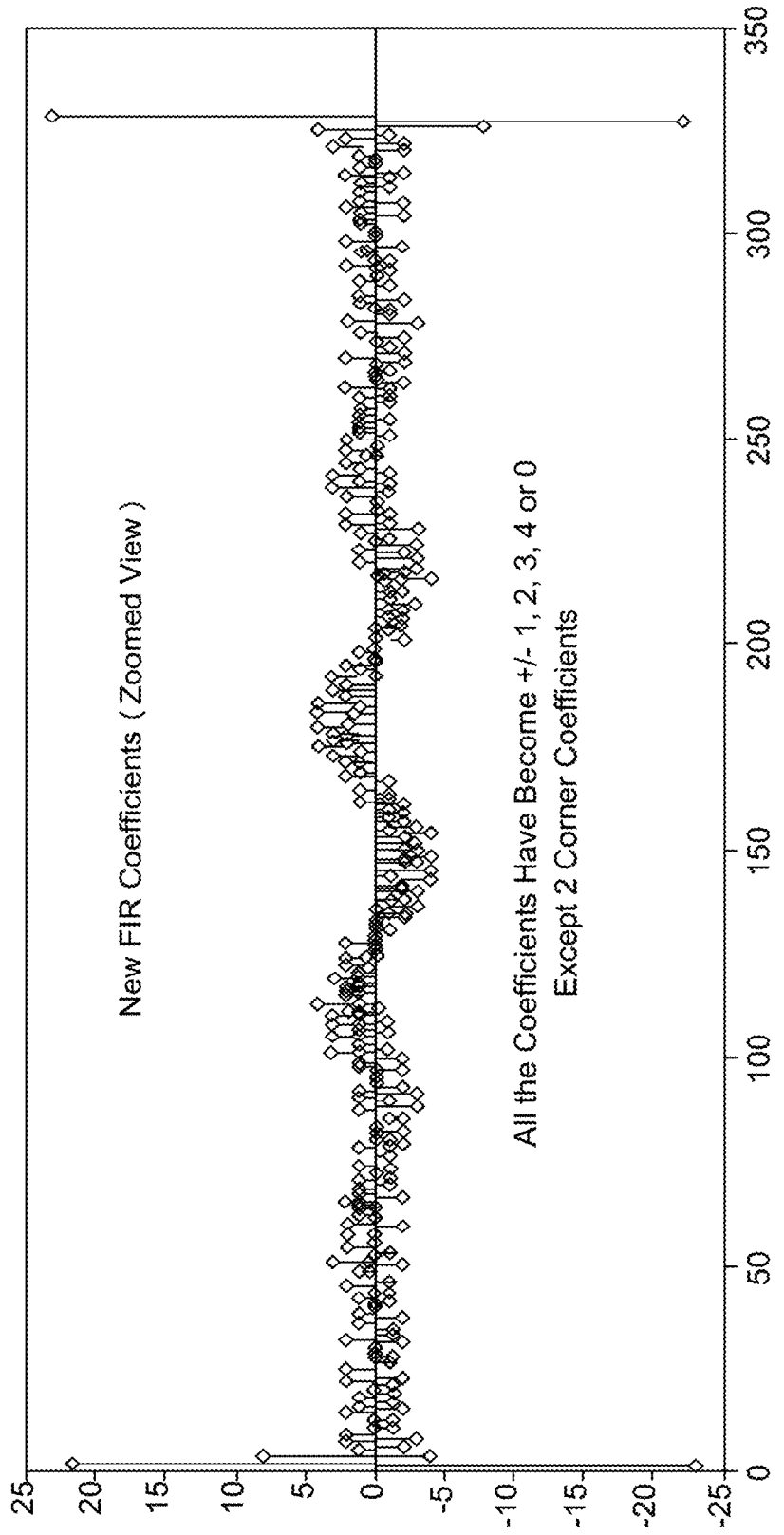
FIG. 3C is a graph of coefficient value as a function of filter tap using the differential coefficient method.

The differential coefficient method is described with reference to FIGS. 3B and 3C. An original FIR coefficient set having a coefficient size of 15 bits for a 325 tap FIR filter having an output precision of 22 bits for an input precision of 6 bits and a decimation factor of 24 is shown in FIG. 3B. As shown, the coefficients have a wide range of values. The new FIR filter coefficients using the differential coefficient method are shown in FIG. 3C. The new FIR filter coefficients of FIG. 3C represent the difference between consecutive coefficients and are represented by a 4 bit word length.

In the example shown all the coefficients of the new FIR filter coefficients that have values of +/−1, 2, 3, 4 or 0, except for coefficients at the ends of the FIR filter. The vertical scale of FIG. 3C is expanded relative to the vertical scale of FIG. 3B. By representing the coefficients with a small number of bits, the circuitry of the FIR filter can be simplified substantially.

Figure 4:
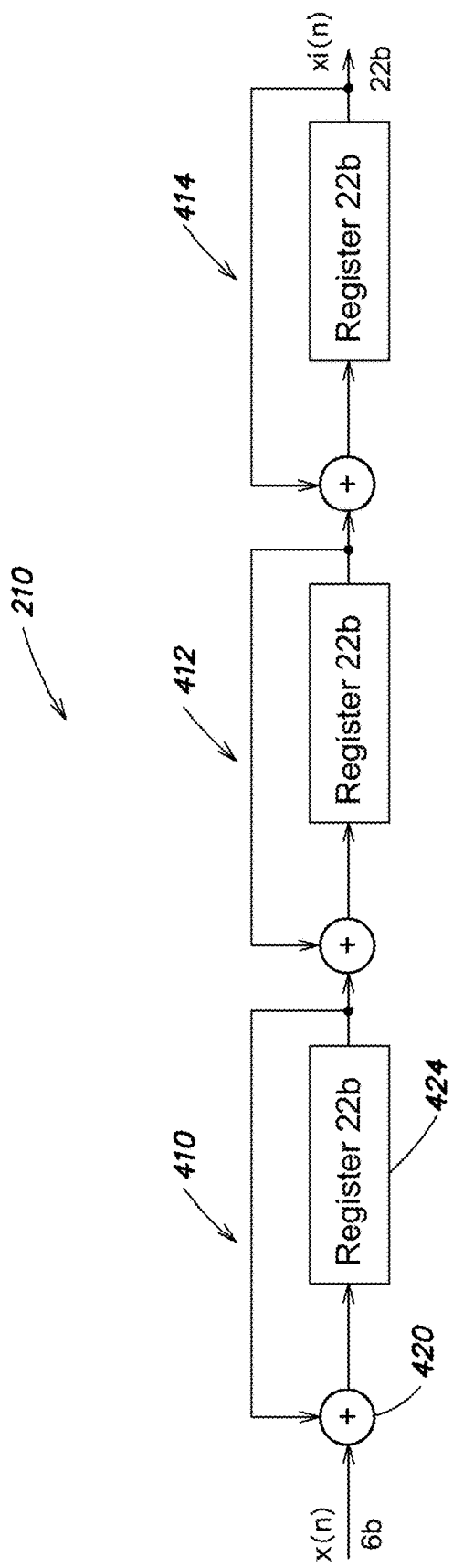
FIG. 4 is a schematic block diagram of the third order integrator of FIG. 3A, in accordance with embodiments.

An implementation of integrator circuit 210 in accordance with embodiments is shown in FIG. 4. The integrator circuit 210 includes a first stage 410, a second stage 412 and a third stage 414 connected in series. As described above, the integrator circuit 210 receives input samples x(n) of 6 bits and provides integrated input samples $x_i(n)$ of 22 bits to FIR filter circuit 220.

Each of the stages 410, 412 and 414 includes a summing unit 420 and a register 424, which, in the example of FIG. 4, is a 22-bit register. A first input of each summing unit 420 receives input values and a second input of each summing unit 420 receives the output of register 424. The output of the summing unit 420 is provided to register 424, and the output of register 424 is provided to the following stage or to the FIR filter circuit 220.

Figure 5:
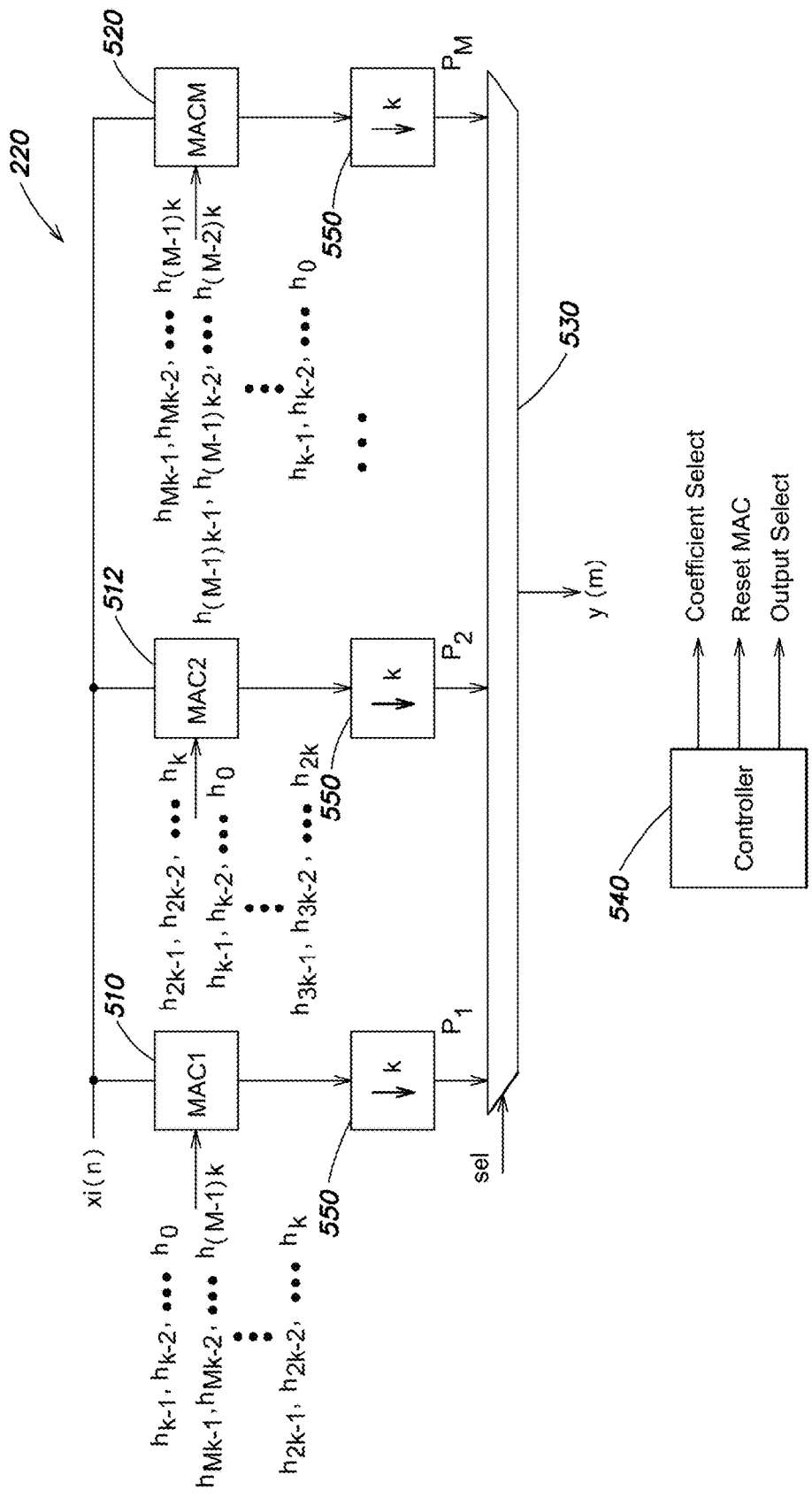
FIG. 5 is a schematic block diagram of a polyphase FIR filter circuit in accordance with embodiments.

A schematic block diagram of FIR filter circuit 220 in accordance with embodiments is shown in FIG. 5. The FIR filter circuit 220 includes a plurality of multiplier accumulator (MAC) circuits 510, 512, . . . 520, an output selector 530 and a controller 540. The FIR filter circuit 220 performs decimation by a decimation factor k, such that the output sample rate is reduced by the factor k with respect to the input sample rate. The decimation is indicated in FIG. 5 by decimation blocks 550. However in practice, the decimation may be effected by operation of the MAC circuits 510, 512, . . . 520 and the output selector 530, such that no circuitry is associated with decimation blocks 550.

Each of the MAC circuits 510, 512, . . . 520 receives integrated input samples $x_i(n)$ from integrator circuit 210 at a first input and receives filter coefficient values at a second input. The values are multiplied and accumulated as described below. Each of the MAC circuits 510, 512, . . . 520 performs multiply and accumulate operations for k input cycles using sets of k coefficients. After every k input cycles, the coefficients of the MAC are changed, but the MAC circuits continue accumulating the results. One of the MAC circuits is selected for producing an output value y(m) after every k input cycles. Thereafter, that MAC circuit is reset and starts accumulating results from a next set of samples and a next set of coefficients. The sets of coefficients applied to each MAC circuit and the MAC circuit selected for output change in a cyclic manner. The selection of coefficients to be applied to each of the MAC circuits and the MAC circuit selected for output are controlled by the controller 540.

The FIR filter circuit 220 may include M MAC circuits, where M is based on the number of filter taps T in a particular FIR filter and the decimation factor k. In particular, the number M of MAC circuits in the FIR filter circuit 220 may be the number of filter taps T divided by the decimation factor k, rounded to the next higher integer if necessary.

As shown in FIG. 5, the filter coefficients h are divided into M sets of coefficients and the sets of coefficients are applied to respective MAC circuits 510, 512, . . . 520. In particular, a first set of coefficients $h_{k-1}, h_{k-2}, \ldots h_0$ is applied to MAC circuit 510 during a first period of k input cycles; a second set of coefficients $h_{2k-1}, h_{2k-2}, \ldots h_k$ is applied to MAC circuit 512 during the first period; and a last set of coefficients $h_{Mk-1}, h_{Mk-2}, \ldots h_{(M-1)k}$ is applied to MAC circuit 520 during the first time period. During consecutive time periods of k input cycles, the sets of coefficients are applied to successive MACs in a rotating manner as shown in FIG. 5.

During each period of k input cycles, the integrated input samples xi(n) are multiplied in each MAC circuit by the respective coefficient values in a convolution operation. Thus, for example in MAC circuit 510 integrated input sample xi(0) is multiplied by coefficient h0, input sample xi(1) is multiplied by coefficient hi, etc., and the results are accumulated. After each period of k input cycles, the sets of coefficients applied to each MAC circuit are changed, as indicated by the second and following rows of coefficients in FIG. 5, and the MAC circuits continue to accumulate results. Every k input cycles, the output selector 530 selects one of the MAC circuits 510, 512, . . . 520 for output, so that output values y(m) are produced at a rate which is reduced by the decimation factor k with respect to the rate of input samples. After a MAC circuit output is selected by output selector 530, that MAC circuit is reset and begins accumulating a new set of input values multiplied by coefficients.

Figure 6:
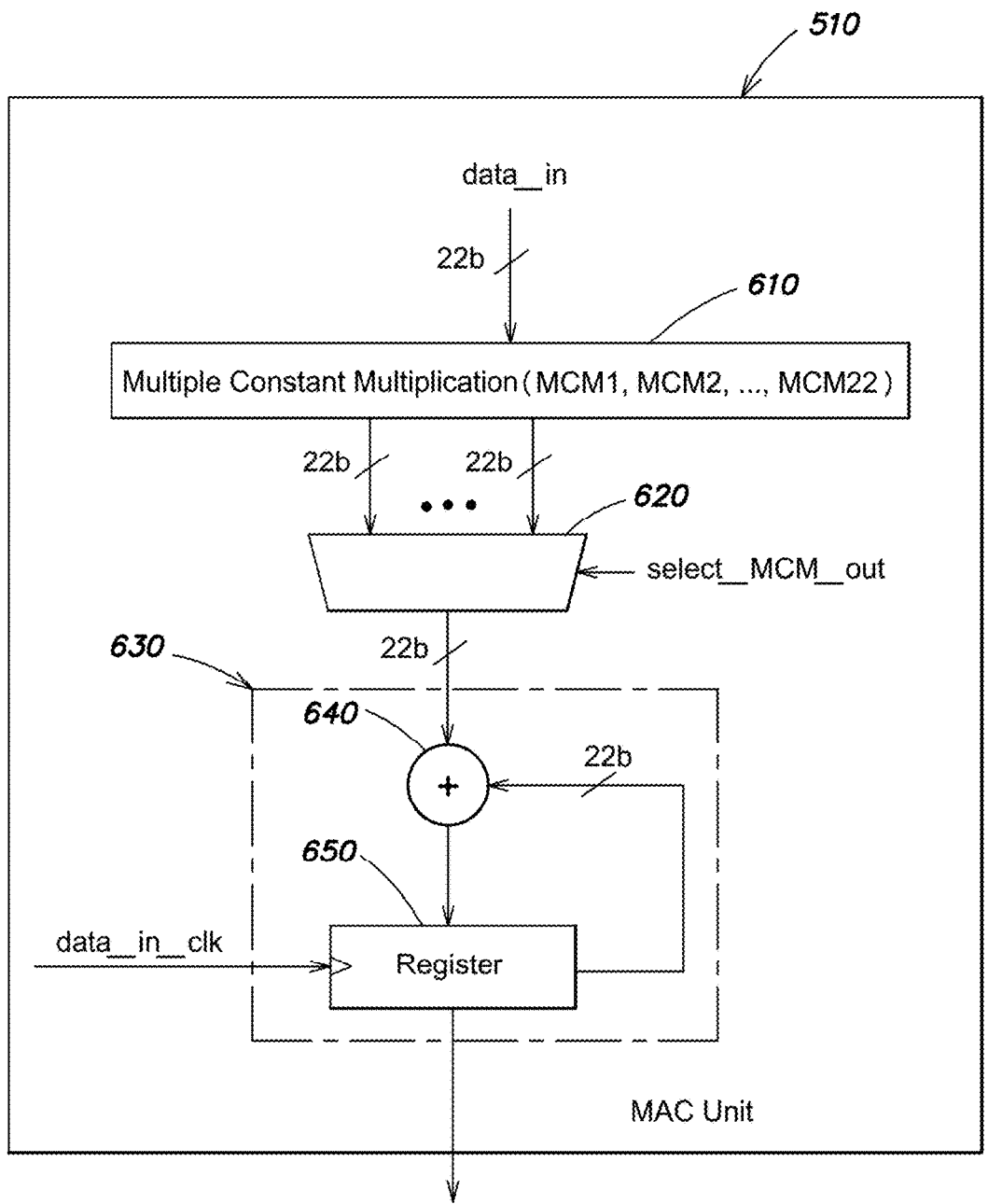
FIG. 6 is a schematic block diagram of a multiplier accumulator circuit shown in FIG. 5, in accordance with embodiments.

A schematic block diagram of a multiplier accumulator circuit 510 in accordance with embodiments is shown in FIG. 6. The MAC circuits 512, . . . 520 may have the same configuration. As shown in FIG. 6, multiplier accumulator circuit 510 includes a multiple constant multiplication (MCM) circuit 610, a data selector 620 and an accumulator 630. The MCM circuit 610 receives the input data values and performs multiplication of the input data values by the small word length coefficient values. As discussed above, the coefficients can be represented in small word lengths by utilizing a differential coefficient method which corresponds to the difference between coefficients rather than the full coefficient values. The MCM circuit 610 may perform multiplication of the data values by the small word length coefficients using shift and add operations rather than multipliers. Each MCM block MCM1, MCM2, etc shown in MCM circuit 610 can be implemented for each set of coefficients $[h_0, h_k, \ldots, h_{(M-1)k}]$, $[h_{k-1}, h_{2k-1}, \ldots, h_{Mk-1}]$, etc respectively.

The MCM circuit 610 provides multiple outputs corresponding to the data input value multiplied by several coefficient values. The data selector 620 selects an appropriate output of the MCM circuit 610 to be provided to accumulator 630. The accumulator 630 includes a summing unit 640 and a register 650. The summing unit 640 sums the value from data selector 620 with the value contained in register 650 and stores the new value in register 650, thereby performing accumulation of the values.

Figure 7:
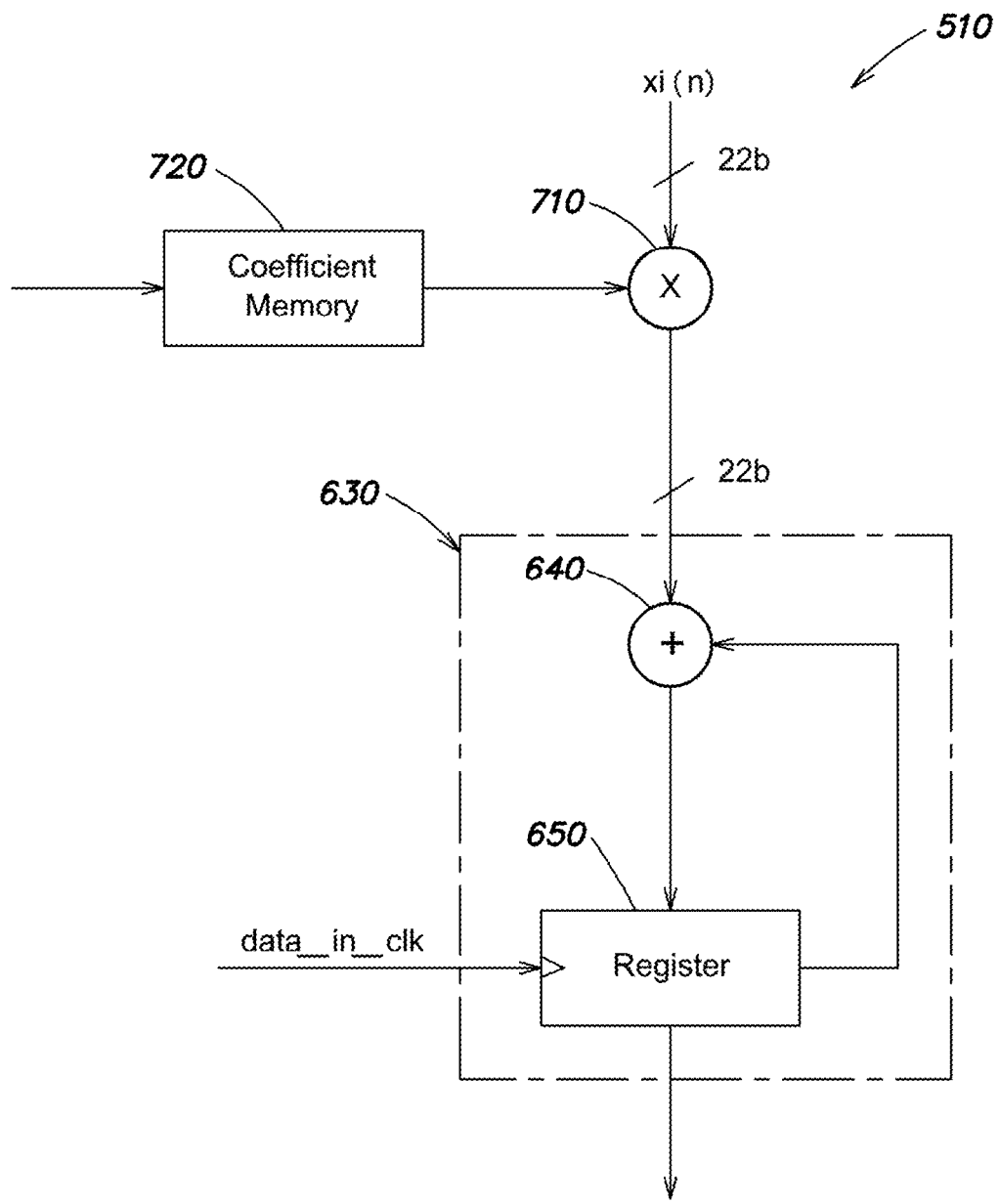
FIG. 7 is a schematic block diagram of a multiplier accumulator circuit shown in FIG. 5, in accordance with additional embodiments.

A schematic block diagram of multiplier accumulator circuit 510 in accordance with additional embodiments is shown in FIG. 7. MAC circuits 512, . . . 520 may utilize the same circuit. In the embodiment of FIG. 7, the MCM circuit 610 and the data selector 620 of FIG. 6 are replaced by a multiplier 710 and a coefficient memory 720, such as a ROM (read only memory). The data input values are supplied to a first input of multiplier 710 and the coefficient values are supplied by coefficient ROM 720 to a second input of multiplier 710. The multiplier 710 multiplies the data values by the corresponding coefficient values and provides outputs to accumulator 630. The accumulator 630 accumulates the input values as discussed above. The coefficient ROM is addressed to provide sets of coefficient values as described above in connection with FIG. 5. The multiplier 710 may be relatively straightforward in view of the fact that the coefficient values from coefficient ROM may have only 2 or 3 bits.

As indicated above, the decimation factor k of the polyphase FIR filter circuit may be programmable. The decimation factor k may be programmed by operating the FIR filter circuit with different coefficient values corresponding to different decimation factors. The decimation factor may be selected by an input signal to controller 540. The controller 540 then controls the MCM circuit 610 of FIG. 6 or the coefficient memory 720 of FIG. 7 to provide the appropriate coefficient values corresponding to the selected decimation factor k.

The polyphase FIR circuit can be implemented using the implementations of the multiplier accumulator circuits described herein and using many other implementations. The polyphase FIR filter circuit can be implemented in transpose or direct form, a transpose implementation being described herein. However, the polyphase FIR filter circuit is not limited to the disclosed implementations.

Figure 8:
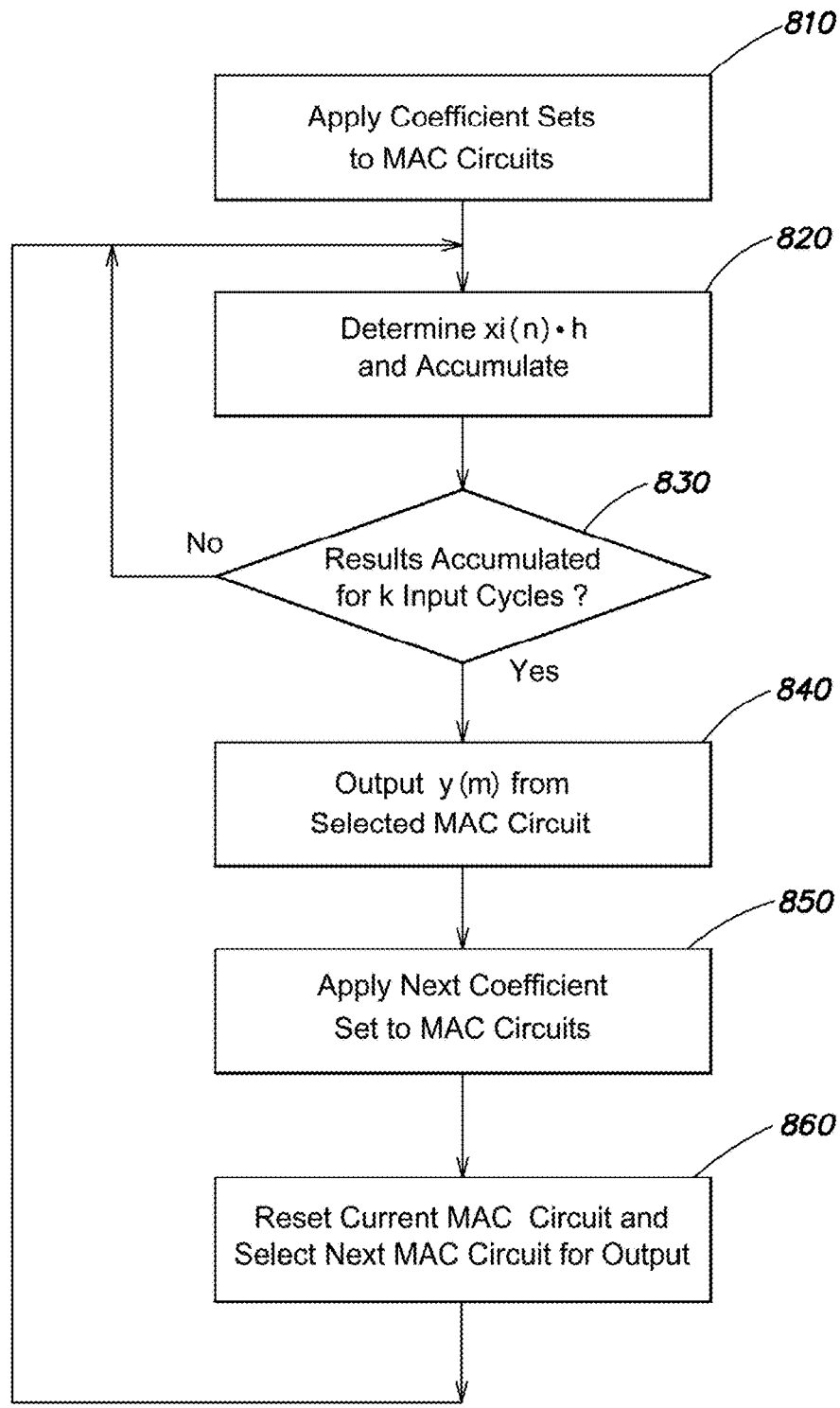
FIG. 8 is a flowchart of a process performed by the polyphase FIR filter circuit of FIG. 5, in accordance with embodiments.

A flowchart of a process performed by the polyphase FIR filter circuit of FIG. 5 in accordance with embodiments is shown in FIG. 8. The process of FIG. 8 may be controlled by the controller 540.

In act 810, coefficient sets are applied to respective MAC circuits 510, 512, . . . 520. With reference to FIG. 5, the coefficient sets in the first row of coefficient sets are applied to respective MAC circuits 510, 512, . . . 520. In act 820, the MAC circuits 510, 512, . . . 520 multiply successive integrated input samples $x_i(n)$ by successive coefficients of the respective coefficient sets and the results are accumulated by the respective MAC circuits.

In act 830, a determination is made as to whether results have been accumulated for k input cycles. As indicated, processing for each input cycle includes multiplying the integrated input sample $x_i(n)$ by the coefficient value and accumulating the result. If it is determined in act 830 that results have not been accumulated for k input cycles, the process returns to act 820 to process the next integrated input sample.

If it is determined in act 830 that results have been accumulated for k input cycles, an output value y(m) is provided from a selected MAC circuit. In particular, the output selector 530 selects one of the MAC circuits 510, 512, . . . 520 to provide an output value.

In act 850, the controller 540 selects next coefficient sets to be applied to MAC circuits 510, 512, . . . 520. For example, the coefficient sets in the second row of FIG. 5 may be applied to the respective MAC circuits.

In act 860, the controller 540 resets the current MAC circuit which has been selected to provide an output value and then selects a next MAC circuit to provide an output value after the next k input cycles. The process then returns to act 820 and integrated input samples are multiplied by coefficient values and accumulated as described above.

A table providing synthesis results for an example filter is shown in FIG. 9. The table compares results for a conventional filter and the proposed filter. The example is a decimation FIR filter having a tap length of 308 and a decimation factor of 22. The table shows the combinational circuit area, the sequential circuit area, the overall circuit area, the total dynamic power and the critical path slack. As shown, the FIR filter described herein has a large savings in combinational area, which results in the large overall savings in area and power. When the same filter is used to implement multiple decimation ratios, the combinational logic used to implement different sets of coefficients will be huge. Therefore the percent saving in combinational area accrued by the disclosed FIR filter will far outweigh the percent increase in sequential area leading to a drastic overall saving. Although the critical path slack is not greatly affected, a timing analysis shows that the major contribution to critical path is from the MAC adder which can be easily pipelined for high frequency operation.

Having thus described at least one illustrative embodiment of the invention, various alterations, modifications and improvements will readily occur to those skilled in the art. Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A polyphase decimation finite impulse response (FIR) filter apparatus comprising:
    a sample integrator circuit configured to integrate input samples of the polyphaser FIR filter apparatus and to provide integrated input samples; and
    a polyphase FIR filter circuit configured to process the integrated input samples and produce output samples with a decimation factor k, the polyphase FIR filter circuit comprising a plurality of multiplier accumulator circuits, each configured to accumulate products of FIR filter coefficients and respective integrated signal samples, wherein
        each of the multiplier accumulator circuits receives a subset of the FIR filter coefficients, a controller selects a multiplier accumulator circuit from the plurality of multiplier accumulator circuits for producing a first output sample of the output samples of the polyphaser FIR filter circuit, and
        the controller resets the selected multiplier accumulator circuit after the selected multiplier accumulator circuit produces the first output sample, wherein the FIR filter coefficients are derived as an nth difference of original filter coefficients, wherein n is a number of integrators in the sample integrator circuit.

2. The polyphase decimation FIR filter apparatus as defined in claim 1, wherein the controller is configured to change the FIR filter coefficients supplied to the multiplier accumulator circuits, such that a decimation factor k is programmable in response to a control signal.

3. The polyphase decimation FIR filter apparatus as defined in claim 1, wherein each of the multiplier accumulator circuits comprises at least one multiple constant multiplication circuit configured to provide products of an integrated input sample and two or more FIR filter coefficients, and an accumulator circuit configured to accumulate the products.

4. The polyphase decimation FIR filter apparatus as defined in claim 1, wherein each of the multiplier accumulator circuits comprises a multiplier configured to receive integrated input samples at a first input and FIR filter coefficients from a coefficient memory at a second input, and an accumulator circuit configured to accumulate output values of the multiplier.

5. The polyphase decimation FIR filter apparatus as defined in claim 1, wherein a number M of multiplier accumulator circuits is equal to a number of filter taps T of the FIR filter divided by the decimation factor k.

6. The polyphase decimation FIR filter apparatus as defined in claim 1, wherein the FIR filter apparatus is configured to provide one output sample for every k input samples.

7. The polyphase decimation FIR filter apparatus as defined in claim 1, wherein the controller is further configured to
    change the subsets of FIR filter coefficients supplied to the multiplier accumulator circuits after every k cycles, and
    select an output of a next one of the multiplier accumulator circuits after every k cycles.

8. The polyphase decimation FIR filter apparatus as defined in claim 1, wherein the subsets of FIR filter coefficients received by each of the multiplier accumulator circuits rotate among the multiplier accumulator circuits in a cyclic manner.

9. The polyphase decimation FIR filter apparatus as defined in claim 1, wherein the FIR filter circuit is configured to perform computation operations with modulo arithmetic.

10. The polyphase decimation FIR filter apparatus as defined in claim 1, wherein each of the input samples have m bits, each of the integrated input samples have p bits, and p is greater than m.

11. The polyphase decimation FIR filter apparatus as defined in claim 1, wherein the sample integrator circuit operates with two's complement arithmetic.

12. The polyphase decimation FIR filter apparatus as defined in claim 1, wherein each of the multiplier accumulator circuits comprises a multiple constant multiplication (MCM) circuit configured to multiply the integrated input samples by the FIR filter coefficients using shift and add operations.

13. A polyphaser decimation FIR filter apparatus comprising:
    a plurality of multiplier accumulator circuits configured to receive a plurality of integrated samples integrated in an integrator circuit comprising n integrators, the plurality of multiplier accumulator circuits comprising
        a first multiplier accumulator circuit having
            a first input configured to receive integrated input samples,
            a second input configured to receive filter coefficients, and
            an output configured to produce an output sample every k input cycles;
        a second multiplier accumulator circuit having
            a first input configured to receive integrated input samples
            a second input configured to receive filter coefficients, and
            an output configured to produce an output sample every k input cycles, wherein the filter coefficients are derived as an nth difference of original filter coefficients, wherein the original filter coefficients have a first word length, and wherein the filter coefficients have a second word length smaller than the first word length;
    an output selector having
        a first input configured to receive output samples from the first multiplier accumulator circuit,
        a second input configured to receive output samples from the second multiplier accumulator circuit,
        a select input configured to select a multiplier accumulator circuit from the plurality of multiplier accumulator circuits, and
        an output configured to produce an output sample from the selected multiplier accumulator circuit every k cycles; and a controller configured to
control the select input of the output selector to select a multiplier accumulator circuit, and
reset the selected multiplier accumulator circuit after the multiplier accumulator circuit is selected.

14. The polyphaser decimation FIR filter apparatus of claim 13, wherein the controller is further configured to change the filter coefficients supplied to the plurality of multiplier accumulator circuits in a cyclic manner.

15. A method for polyphase decimation FIR filtering, comprising:
integrating input samples of a polyphase FIR filter circuit, by a sample integrator circuit, to provide integrated input samples; and
processing the integrated input samples, by the polyphase FIR filter circuit, to provide output samples, the processing comprising:
accumulating products of coefficients and the integrated input samples in respective multiplier accumulator circuits, wherein each of the respective multiplier accumulator circuits receives a subset of k coefficients, and wherein the coefficients are derived as an nth difference of original coefficients, wherein n is a number of integrators in the sample integrator circuit;
selecting an output of a selected multiplier accumulator circuit from the multiplier accumulator circuits after every k cycles, where k is a decimation factor; and
changing the subsets of k coefficients supplied to the respective multiplier accumulator circuits after every k cycles.

16. The method as defined in claim 15, further comprising changing the subsets of k coefficients supplied to the multiplier accumulator circuits, such that the decimation factor k is programmable in response to a control signal.

17. The method as defined in claim 15, wherein each of the multiplier accumulator circuits comprises at least one multiple constant multiplication circuit configured to provide products of an integrated input sample and two or more coefficients, and an accumulator circuit configured to accumulate the products.

18. The method as defined in claim 15, wherein each of the multiplier accumulator circuits comprises a multiplier configured to receive integrated input samples at a first input and coefficients from a coefficient memory at a second input, and an accumulator circuit configured to accumulate output values of the multiplier.

19. The method as defined in claim 15, wherein processing further comprises resetting the selected multiplier accumulator circuit after providing an output of the FIR filter circuit.

20. The method as defined in claim 15, wherein a number M of multiplier accumulator circuits is equal to a number of filter taps T of the FIR filter divided by the decimation factor k.

21. The method as defined in claim 15, wherein processing comprises providing one output value for every k input samples.

22. The method as defined in claim 15, wherein the original coefficients have a first word length, and wherein the coefficients have a second word length smaller than the first word length.

* * * * *